United States Patent
Tran et al.

(10) Patent No.: US 7,557,607 B1
(45) Date of Patent: Jul. 7, 2009

(54) INTERFACE DEVICE RESET

(75) Inventors: Dai D. Tran, Santa Clara, CA (US); Jerry A. Case, San Jose, CA (US)

(73) Assignee: XILINX, Inc., San Jose, CA (US)

( * ) Notice: Subject to any disclaimer, the term of this patent is extended or adjusted under 35 U.S.C. 154(b) by 0 days.

(21) Appl. No.: 11/803,522

(22) Filed: May 14, 2007

(51) Int. Cl.
*H03K 19/177* (2006.01)

(52) U.S. Cl. .......................................... 326/39; 326/41

(58) Field of Classification Search ............. 326/37–41, 326/93; 710/72, 93, 300
See application file for complete search history.

(56) References Cited

U.S. PATENT DOCUMENTS

| | | | |
|---|---|---|---|
| 5,703,498 A | * 12/1997 | Gould et al. ................... 326/40 |
| 5,781,756 A | 7/1998 | Hung |
| 5,857,086 A | 1/1999 | Horan et al. |
| 5,892,961 A | 4/1999 | Trimberger |
| 6,067,595 A | 5/2000 | Lindenstruth |
| 6,160,418 A | * 12/2000 | Burnham ...................... 326/38 |
| 6,204,687 B1 | 3/2001 | Schultz et al. |
| 6,292,021 B1 | * 9/2001 | Furtek et al. ................... 326/41 |
| 6,294,925 B1 | * 9/2001 | Chan et al. ..................... 326/37 |
| 6,340,897 B1 | * 1/2002 | Lytle et al. ..................... 326/40 |
| 6,522,167 B1 | 2/2003 | Ansari et al. |
| 6,792,578 B1 | 9/2004 | Brown et al. |
| 6,903,575 B1 | 6/2005 | Davidson et al. |
| 6,976,160 B1 | 12/2005 | Yin et al. |
| 7,003,423 B1 | 2/2006 | Kabani et al. |
| 7,126,372 B2 | 10/2006 | Vadi et al. |
| 7,190,190 B1 | 3/2007 | Camarota et al. |
| 7,200,832 B2 | 4/2007 | Butt et al. |
| 7,274,213 B1 | 9/2007 | Meyer et al. |
| 7,328,335 B1 | 2/2008 | Sundararajan et al. |
| 7,353,162 B2 | 4/2008 | Huang et al. |

OTHER PUBLICATIONS

"PCI Express PIPE Endpoint LogiCORE Product Specification," DS321 (v1.1), Apr. 11, 2005, pp. 1-14, Xilinx, Inc.
"PCI Express Endpoint Cores v3.4 Product Specification," DS506, Feb. 15, 2007, pp. 1-20, Xilinx, Inc.
U.S. Appl. No. 11/803,521, filed May 14, 2007, Stadler, Laurent Fabris, Hard Macro-to-User Logic Interface, Xilinx, Inc. 2100 Logic Drive, San Jose, Ca 95124.
U.S. Appl. No. 11/803,516, filed May 14, 2007, Kolze, Paige A., et al., Configurable Interface, Xilinx, Inc. 2100 Logic Drive, San Jose, Ca 95124.
U.S. Appl. No. 11/803,556, filed May 14, 2007, McCarthy, Patrick C., et al., Interface Device Lane Configuration, Xilinx, Inc. 2100 Logic Drive, San Jose, Ca 95124.
U.S. Appl. No. 11/803,517, filed May 14, 2007, Case, Jerry A., Reconfiguration of a Hard Macro Via Configuration Registers, Xilinx, Inc. 2100 Logic Drive, San Jose, Ca 95124.

* cited by examiner

*Primary Examiner*—James H. Cho
*Assistant Examiner*—Crystal L Hammond
(74) *Attorney, Agent, or Firm*—W. Eric Webostad; Thomas George

(57) ABSTRACT

Reset of an interface device of an integrated circuit is described. A Peripheral Component Interconnect Express core is instantiated as an application specific circuit block in the integrated circuit. The core has a reset block configured to be in either a hierarchical reset mode or a hierarchical/separate reset mode. In the hierarchical reset mode, the reset block is configured to assert a reset signal selected of a plurality of reset signals and to automatically assert each and every other reset signal of the plurality of reset signals lower in a reset hierarchy than the reset signal selected.

19 Claims, 9 Drawing Sheets

|  | MGMT 511 | NV 512 | MAC 513 | LINK 514 | USER TLM 515 | USER CMM 516 |
|---|---|---|---|---|---|---|
| MGMT 511 | X |  |  |  |  | X |
| NV 512 |  | X |  |  |  | X |
| MAC 513 |  |  | X |  |  | X |
| LINK 514 |  |  |  | X |  | X |
| USER TLM 515 |  |  |  |  | X | X |
| USER CMM 516 |  |  |  |  |  | X |

| RESET PIN | ASSERTED |
|---|---|
| MGMT 511 | N |
| NV 512 | Y |
| MAC 513 | N |
| LINK 514 | N |
| USER TLM 515 | N |
| USER CMM 516 | N |

| RESET PIN | ASSERTED |
|---|---|
| MGMT 511 | Y |
| NV 512 | N |
| MAC 513 | N |
| LINK 514 | N |
| USER TLM 515 | N |
| USER CMM 516 | N |

FIG. 7A

|  | MGMT 511 | NV 512 | MAC 513 | LINK 514 | USER TLM 515 | USER CMM 516 |
|---|---|---|---|---|---|---|
| MGMT 511 | X |  |  |  |  |  |
| NV 512 | X | X |  |  |  |  |
| MAC 513 |  |  | X |  |  |  |
| LINK 514 |  |  |  | X |  |  |
| USER TLM 515 |  |  |  |  | X |  |
| USER CMM 516 |  |  |  |  |  | X |

FIG. 8

| RESET PIN | ASSERTED |
|---|---|
| MGMT 511 | N |
| NV 512 | Y |
| MAC 513 | Y |
| LINK 514 | Y |
| USER TLM 515 | Y |
| USER CMM 516 | Y |

INTERFACE DEVICE RESET

CROSS-REFERENCE TO RELATED APPLICATIONS

This application is related to the following co-pending U.S. patent applications: U.S. patent application entitled "Interface Lane Device Configuration," by Patrick C. McCarthy, et al., U.S. patent application entitled "Configurable Interface," by Paige A. Kolze, et al., U.S. patent application entitled "Hard Macro-to-User Logic Interface," by Laurent Stadler, and U.S. patent application entitled "Reconfiguration of a Hard Macro via Configuration Registers," by Jerry A. Case, each of which was filed on the same day as the present application and each of which is assigned to the assignee of the present application. The entire contents of each of the above-referenced co-pending patent applications are incorporated herein by reference for all purposes.

FIELD OF THE INVENTION

One or more aspects of the invention relate generally to integrated circuits, and, more particularly, to reset of an interface device of an integrated circuit.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. Notably, as used herein, "include" and "including" mean including without limitation.

One such FPGA is the Xilinx Virtex™ FPGA available from Xilinx, Inc., 2100 Logic Drive, San Jose, Calif. 95124. Another type of PLD is the Complex Programmable Logic Device ("CPLD"). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. Other PLDs are programmed by applying a processing layer, such as a metal layer, that programmably interconnects the various elements on the device. These PLDs are known as mask programmable devices. PLDs can also be implemented in other ways, for example, using fuse or antifuse technology. The terms "PLD" and "programmable logic device" include but are not limited to these exemplary devices, as well as encompassing devices that are only partially programmable.

For purposes of clarity, FPGAs are described below though other types of PLDs may be used. FPGAs may include one or more embedded microprocessors. For example, a microprocessor may be located in an area reserved for it, generally referred to as a "processor block."

Heretofore, performance of a design instantiated in programmable logic of an FPGA ("FPGA fabric") using a Peripheral Component Interconnect ("PCI") Express ("PCIe") internal to such FPGA was limited to performance of a PCIe design for instantiation in FPGA fabric ("soft core"). Additional details regarding examples of PCIe soft cores are available from Xilinx, Inc. of San Jose, Calif. and are described in "PCI Express PIPE Endpoint LogiCORE Product Specification," DS321 (v1.1), Apr. 11, 2005 and in "PCI Express Endpoint Cores v3.4 Product Specification," DS506, Feb. 15, 2007, both available from Xilinx, Inc.

PCIe soft cores have been implemented as an "Endpoint" architecture. Target applications for such Endpoint architecture include: test equipment, consumer graphics boards, medical imaging equipment, data communication networks, telecommunication networks, broadband deployments, cross-connects, workstation and mainframe backbones, network interface cards, chip-to-chip and backplane interconnect, crossbar switches, wireless base stations, high bandwidth digital video, and high bandwidth server applications, among other known add-in cards, host bus adapters, and other known applications.

Accordingly, it would be desirable and useful to provide a PCIe Endpoint internal to an FPGA having enhanced performance over that of a PCIe soft core instantiated in FPGA fabric.

SUMMARY OF THE INVENTION

One or more aspects of the invention generally relate to integrated circuits, and, more particularly, to reset of an interface device of an integrated circuit.

An aspect of the invention is a programmable logic device that includes a Peripheral Component Interconnect Express core instantiated as an application specific circuit block in the programmable logic device. The core has a reset block configurable to be in either a hierarchical reset mode or a hierarchical/separate reset mode. In the hierarchical reset mode, the reset block is configured to assert a reset signal selected of a plurality of reset signals and to automatically assert each and every other reset signal of the plurality of reset signals lower in a reset hierarchy than the reset signal selected.

Another aspect of the invention is a method for resetting an integrated circuit with an application specific circuit block, namely a Peripheral Component Interconnect Express core. A reset block of the core is configured to be in either of a first reset mode or a second reset mode. A power-on reset state is coupled to a first reset input of the reset block. The first reset input is associated with a highest-level reset signal of a reset hierarchy associated with the core. The reset hierarchy includes a plurality of reset signals. The highest-level reset signal is one of the plurality of reset signals. The power-on reset state for the integrated circuit is initiated causing the highest-level reset signal to be asserted. The core is reset, and each of the plurality of reset signals is asserted responsive to assertion of the highest-level reset signal.

Yet another aspect of the invention is a method for resetting an integrated circuit with an application specific circuit block, namely a Peripheral Component Interconnect Express core. A reset block of the core is configured to be in either of a hierarchical reset mode and a hierarchical/separate reset mode, the reset block being associated with a plurality of reset signals in a reset hierarchy. In the hierarchical reset mode, a selected reset signal of the plurality of reset signals is asserted. Each and every other reset signal of the plurality of reset signals lower in the reset hierarchy than the selected reset signal is automatically asserted. At least a portion of the core is reset responsive to the asserting.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

FIG. 6 is a table diagram depicting an exemplary embodiment of a hierarchical reset mode.

FIGS. 7A and 7B are table diagrams depicting exemplary embodiments of a power-on reset condition and a non-volatile reset condition, respectively, for a hierarchical reset mode.

FIG. 8 is a table diagram depicting an exemplary embodiment of a hybrid hierarchical/separate reset mode.

FIG. 9 is a table diagram depicting an exemplary embodiment of a non-volatile reset condition for a hybrid hierarchical/separate reset mode.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
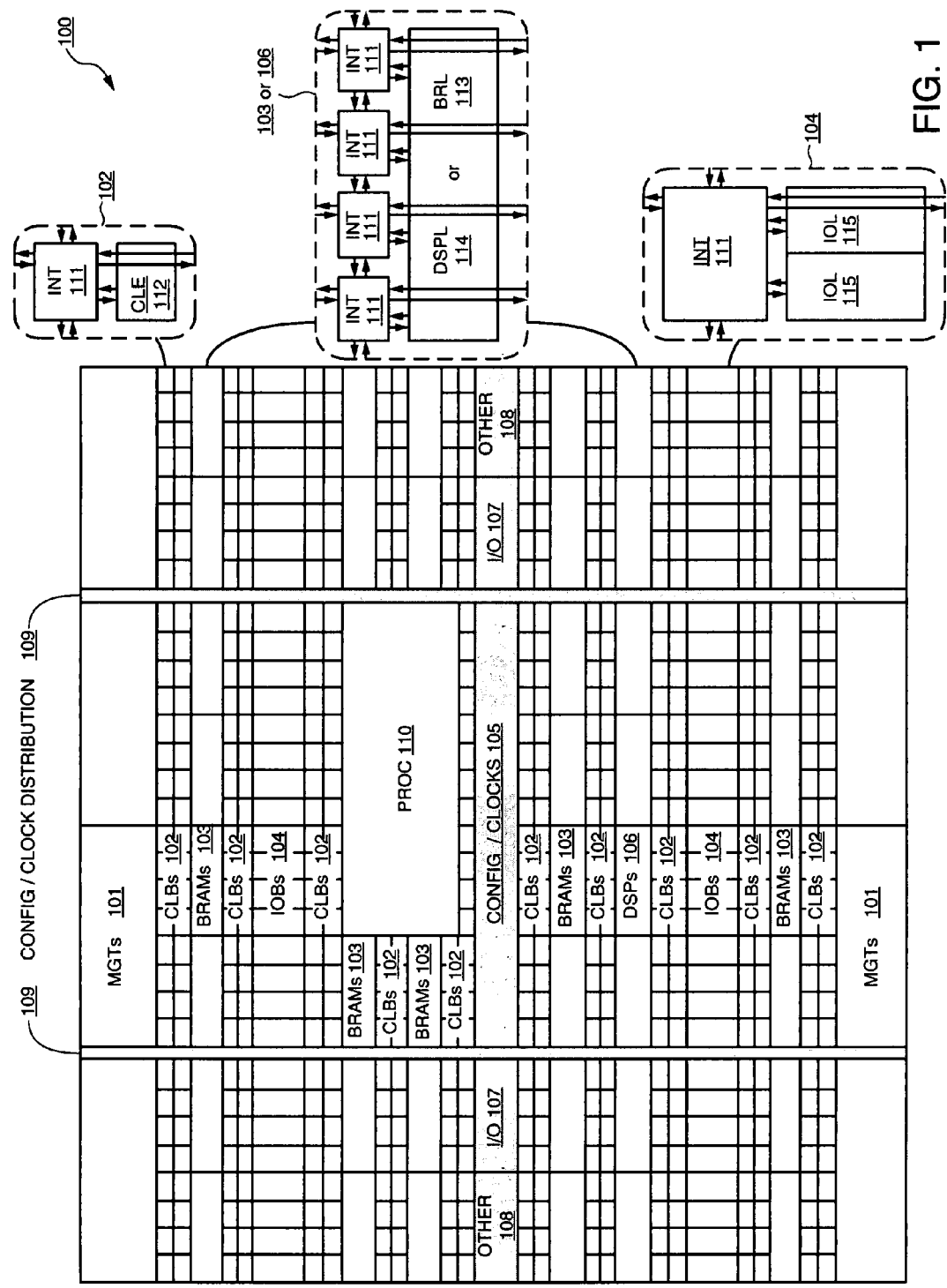
FIG. 1 is a simplified block diagram depicting an exemplary embodiment of a columnar Field Programmable Gate Array ("FPGA") architecture in which one or more aspects of the invention may be implemented.

FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output ports ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element 111 in each adjacent tile. Therefore, the programmable interconnect elements 111 taken together implement the programmable interconnect structure for the illustrated FPGA. Each programmable interconnect element 111 also includes the connections to and from any other programmable logic element(s) within the same tile, as shown by the examples included at the right side of FIG. 1.

For example, a CLB 102 can include a configurable logic element ("CLE") 112 that can be programmed to implement user logic plus a single programmable interconnect element 111. A BRAM 103 can include a BRAM logic element ("BRL") 113 in addition to one or more programmable interconnect elements 111. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element ("DSPL") 114 in addition to an appropriate number of programmable interconnect elements 111. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 are manufactured using metal layered above the various illustrated logic blocks, and typically are not confined to the area of the I/O logic element 115.

In the pictured embodiment, a columnar area near the center of the die (shown shaded in FIG. 1) is used for configuration, I/O, clock, and other control logic. Vertical areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the right side of FIG. 1 are purely exemplary. For example, in an actual FPGA more than one adjacent column of CLBs is typically included wherever the CLBs appear, to facilitate the efficient implementation of user logic. FPGA 100 illustratively represents a columnar architecture, though FPGAs of other architectures, such as ring architectures for example, may be used. FPGA 100 may be a Virtex-4™ FPGA from Xilinx of San Jose, Calif.

Figure 2:
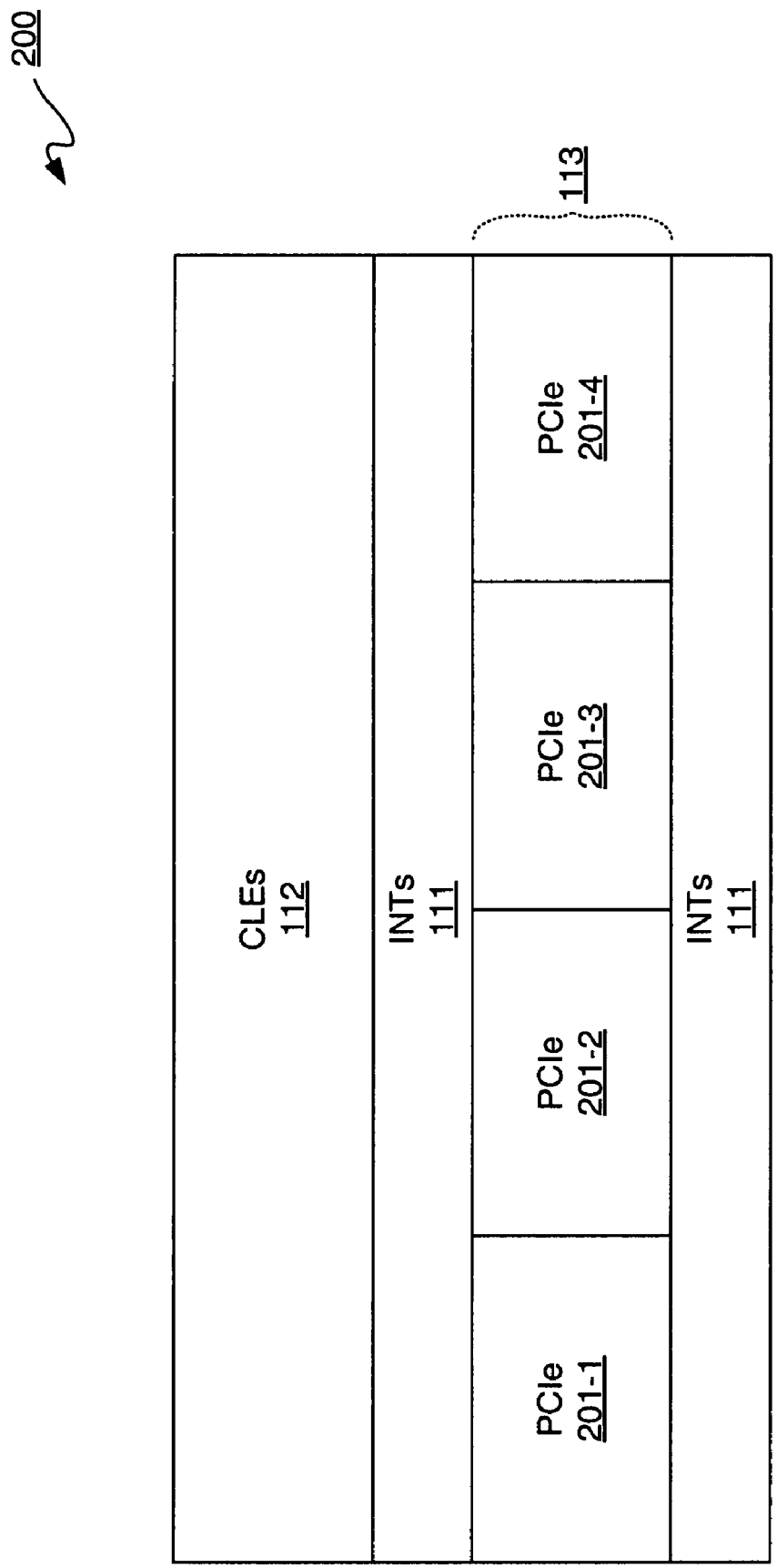
FIG. 2 is a block diagram depicting an exemplary embodiment of a portion of an FPGA with a column of Peripheral Component Interconnect ("PCI") Express ("PCIe") Application Specific Integrated Circuit ("ASIC") cores, namely PCIe hard cores.

FIG. 2 is a block diagram depicting an exemplary embodiment of a portion of an FPGA 200. FPGA 200 may be substantially similar to FPGA 100 of FIG. 1. However, in place of a column of BRLs 113 are located PCIe Application Specific Integrated Circuit ("ASIC") cores, namely PCIe hard cores. Notably, rather than using a column of BRLs 113, other columns in FPGA 100 of FIG. 1 may be used. PCIe hard cores 201-1 through 201-4 are illustratively shown between two columns of INTs 111. Though four PCIe hard cores 201-1 through 201-4 are illustratively shown, fewer or more than four PCIe hard cores may be implemented in an FPGA.

Figure 3:
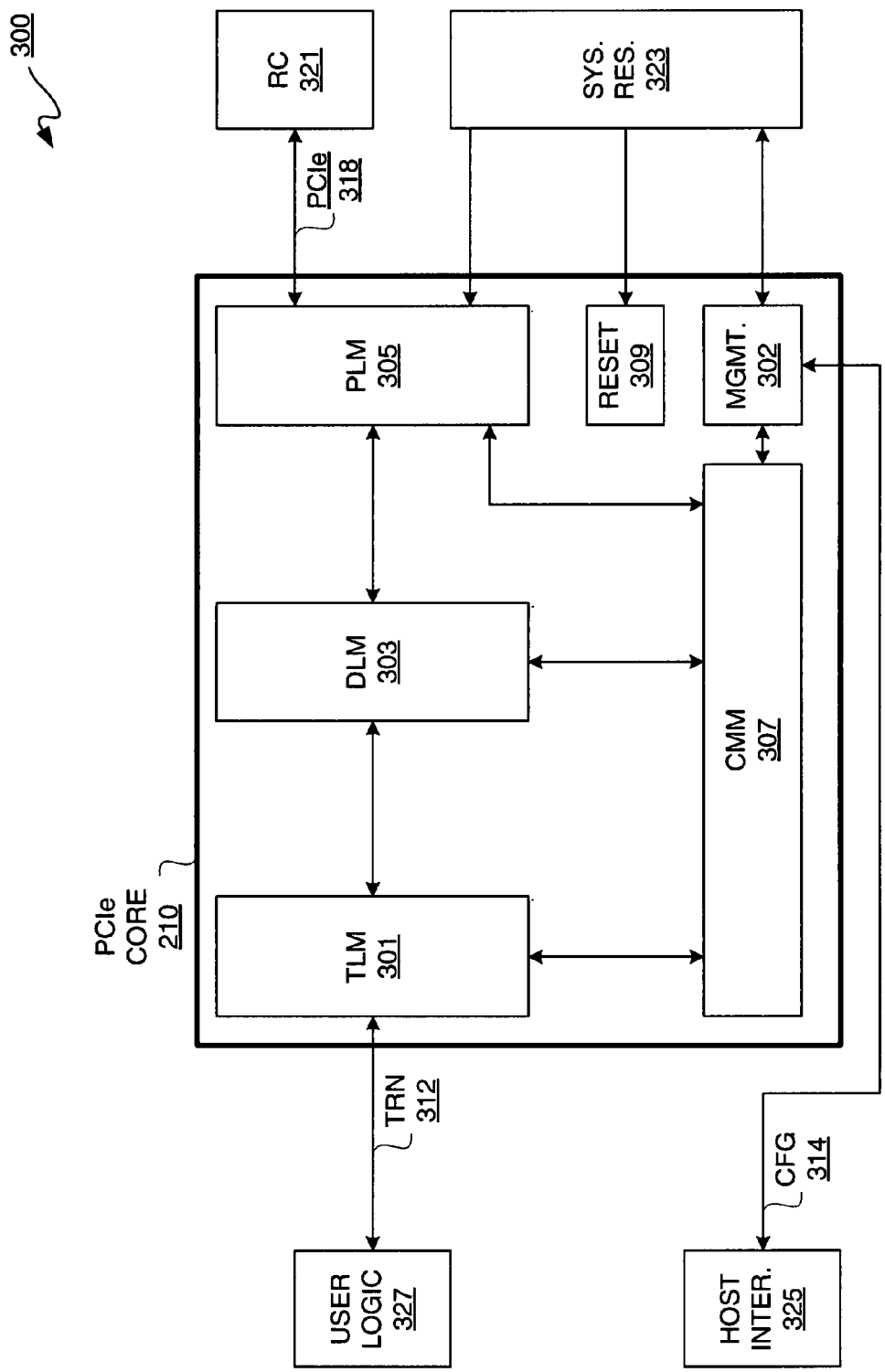
FIG. 3 is a block diagram depicting an exemplary embodiment of a PCIe system.

FIG. 3 is a block diagram depicting an exemplary embodiment of PCIe system 300. PCIe system 300 may be implemented in an FPGA. PCIe system 300 includes a PCIe hard core ("PCIe core") 210, which may be a PCIe hard core of PCIe hard cores 201-1 through 201-4 of FIG. 2, coupled to a Root Complex 321, user logic 327, host interface 325, and system resources 323. PCIe core 210 includes a physical layer module ("PLM") 305, a datalink layer module ("DLM") 303, a transaction layer module ("TLM") 301, a configuration management module ("CMM") 307, a management block 302, and a reset block 309.

Within PCIe core 210, TLM 301 is coupled to DLM 303 for bidirectional communication, and DLM 303 is coupled to PLM 305 for bidirectional communication. Additionally, each of TLM 301, DLM 303, and PLM 305 is coupled to CMM 307 for bidirectional communication. Reset block 309 is coupled to TLM 301, DLM 303, PLM 305, CMM 307, and management block 302, though not illustratively shown in FIG. 3 for purposes of clarity. Management block 302 is coupled via a read/write interface to CMM 307.

PLM 305 is coupled to Root Complex 321 via PCIe interface 318. Additionally, PLM 305 may be coupled to system resources 323 for receiving a clock signal. Reset block 309 may be coupled to system resources 323 for receiving reset signaling. Management block 302 may be coupled to system resources 323 for dynamic configuration and status monitoring. Configuration interface 314 may couple host interface 325 to management block 302, and host interface 325 may thus be coupled to CMM 307 via configuration interface 314 and management block 302. User logic 327, which may be instantiated in FPGA fabric, is coupled to TLM 301 via transaction interface 312.

With continuing reference to FIG. 3, it should be understood that a PCIe core 210 may be what is known as an "Endpoint." Examples of applications of PCIe Endpoints include graphics cards, memory cards, and the like. In this example, a PCIe core 210 is implemented in an FPGA as an ASIC. However, user logic 327 may be configured for an application implemented with FPGA resources which would interface to such PCIe core 210. Additionally, multiple PCIe cores 210 may be coupled to a Root Complex 321 to provide a PCIe network, an example of which is described in additional detail with reference to FIG. 4 below.

Host interface 325 may be an interface to a processor of a processor block 110 of FIG. 1, namely an embedded processor, or may be a host interface to another type of host. Examples of other types of hosts include a microprocessor instantiated in FPGA fabric, such as a MicroBlaze microprocessor available from Xilinx, Inc. of San Jose, Calif. Another example of a host may be a sequencer instantiated in FPGA fabric, or other known host device that may be instantiated in FPGA fabric.

Figure 4:
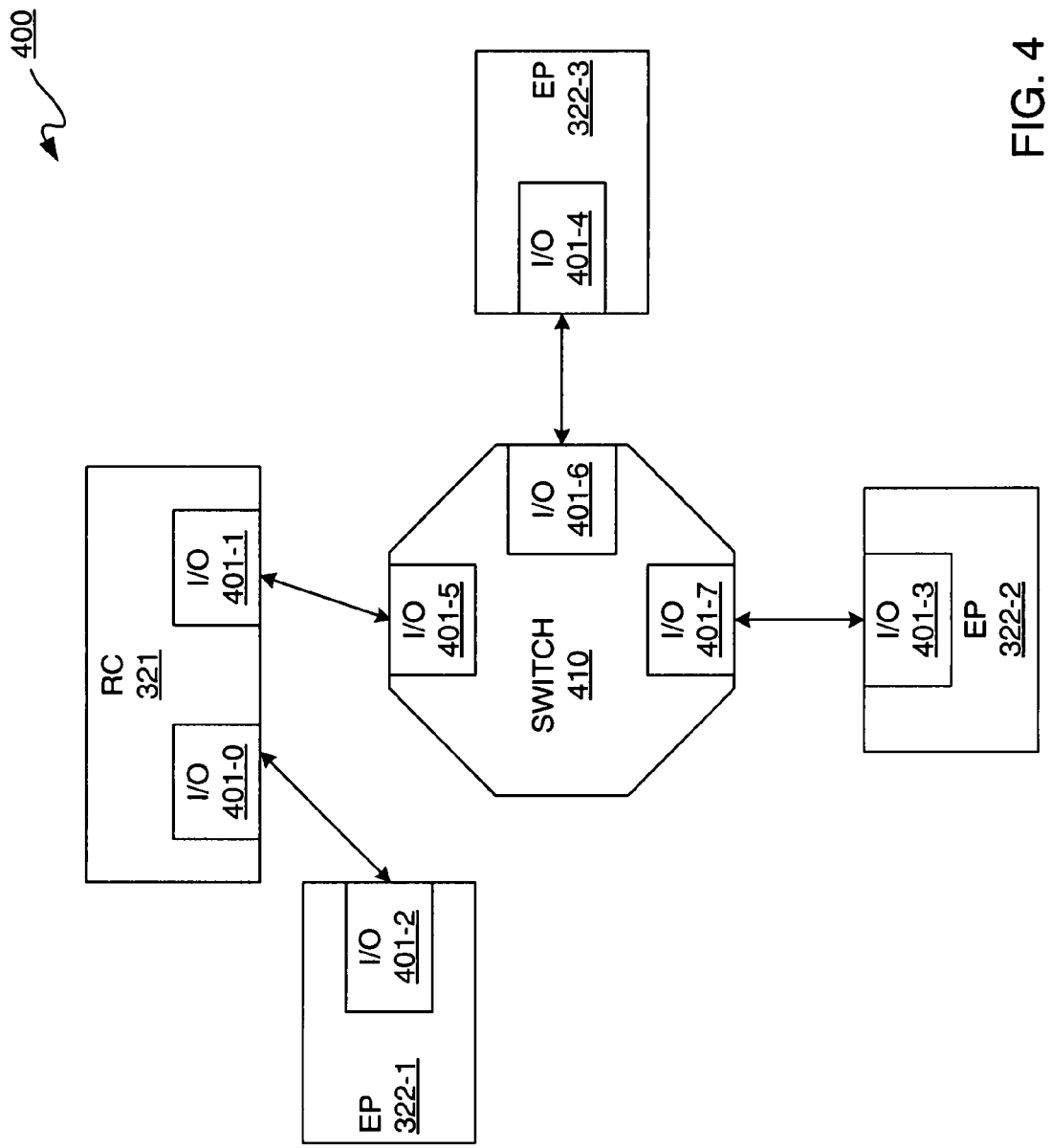
FIG. 4 is a network diagram depicting an exemplary embodiment of a PCIe network.

FIG. 4 is a network diagram depicting an exemplary embodiment of a PCIe network 400. PCIe network 400 includes Root Complex ("RC") 321, and Endpoints ("EPs") 322-1 through 322-3. Although a Root Complex 321 and three Endpoints 322-1 through 322-3 are illustratively shown, it should be appreciated that fewer or more of each may be implemented. PCIe network 400 may be implemented on a single FPGA, where switch matrix 410 is implemented using programmable interconnects, among other details described below.

Root Complex 321 includes I/O blocks 401-0 and 401-1. I/O block 401-0 is directly coupled to I/O block 401-2 of Endpoint 322-1. With reference to FPGA 100 of FIG. 1, I/O blocks 401-0 through 401-2 for example may be implemented using I/O 107 or MGTs 101 of FIG. 1. Moreover, I/O blocks 401-0 through 401-2 for example may be implemented using one or more IOBs 104 of FIG. 1. Root Complex 321 is coupled to Endpoints 322-2 and 322-3 via switch matrix 410. Switch matrix 410 may be implemented as a known PCIe switch block. Accordingly, switch matrix 410 may include I/O blocks 401-5 through 401-7 for respectively coupling to I/O blocks 401-1, 401-4, and 401-3, where I/O blocks 401-3 and 401-4 are respectively of Endpoints 322-2 and 322-3.

Having this understanding of a PCIe network 400, and a PCIe hard core 210 of FIG. 3, both of which may be implemented in an FPGA, a more detailed description of reset block 309 of FIG. 3 and its application to PCIe core 210 of FIG. 3 is provided.

Figure 5:
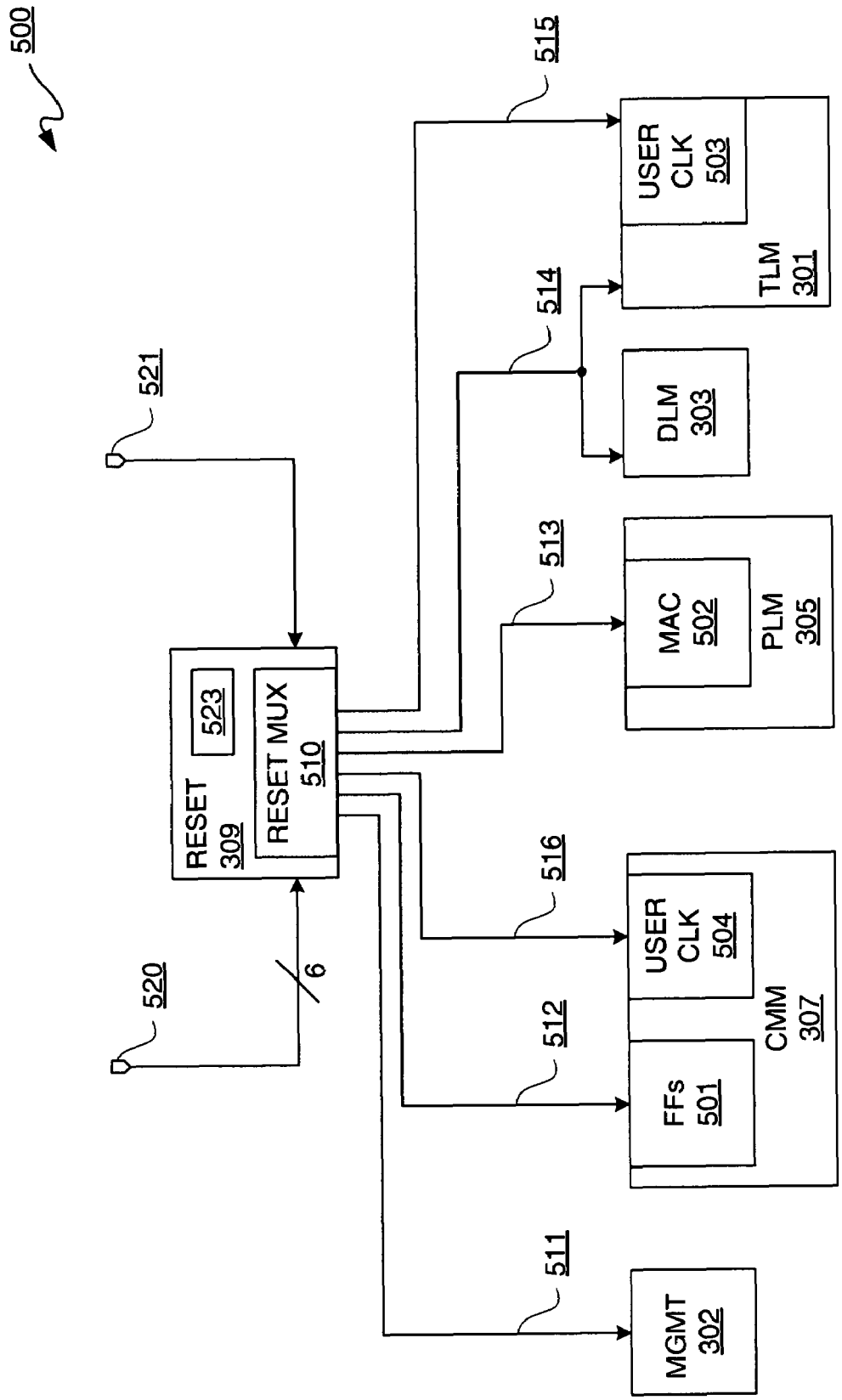
FIG. 5 is a block diagram depicting an exemplary embodiment of a PCIe hard core.

FIG. 5 is a block diagram depicting an exemplary embodiment of a PCIe hard core 500. PCIe hard core ("PCIe core") 500 may be PCIe core 210 of FIG. 3 implemented in an FPGA. With simultaneous reference to FIGS. 3 and 5, PCIe core 500 is further described. PCIe core 500 includes reset block 309. Reset block 309 may include a reset multiplexer circuit ("reset multiplexer") 510. Reset multiplexer 510 may be coupled for receiving reset signaling 520. Reset signaling 520 may be provided via system resources 323 of FIG. 3 to reset block 309. Alternatively, a packet may be provided to PCIe core 210 for providing reset signaling 521 to reset block 309. However, for purposes of clarity by way of example and not limitation, it shall be assumed that reset signaling 520 is provided via system resources 323 to six pins of PCIe core 500 internal to FPGA 200 of FIG. 2 for access to a reset block 309 of PCIe core 500.

The six pins may be associated with six separate reset signals. These reset signals, illustratively shown emanating from reset multiplexer 510, are reset signals 511 through 516. Reset signal 511 is provided to management block 302. Reset signal 512 is provided to configuration flip-flops 501 of CMM 307. Reset signal 512 may be referred to as a non-volatile reset to indicate that configuration flip-flops 501 are being reset. Alternatively to or in combination with flip-flops, other known storage devices which are resettable may be used. Reset signal 513 is provided to a media access controller ("MAC") 502 of PLM 305. Reset signal 514 is provided to DLM 303 and TLM 301. Reset signal 515 is provided to a user clock domain portion 503 of TLM 301. Lastly, reset signal 516 is provided to a user clock domain portion 504 of CMM 307.

MAC 502 may include a state machine, as is known for a PCIe MAC. Accordingly, reset signal 513 may be used for resetting state of such state machine. Reset signal 515 may be used to reset TLM 301 including a user clock domain portion 503 thereof. It should be noted that reset signal 514, while resetting DLM 303 and TLM 301, does not reset a user clock domain portion 503 of TLM 301. Thus, in order to reset all of TLM 301, including user clock domain portion 503, reset signal 515 may be used.

With continuing reference to FIG. 5, it should be appreciated that PCIe core 500 may go into a power saving mode, and accordingly it may be desirable to reset some, but not all, circuits thereof. The circuits which are reset may be subject to the degree of standby to which PCIe core 500 may be placed for such a power saving mode. A power saving mode is just one example of where different resets may be used. Other examples may include "fundamental" reset and in-band "hot" reset reception for a Root Complex, among others.

Notably, there is a hierarchical relationship generally among reset signals 511 through 516. At the highest level is reset signal 511. This is because reset signal 511 is associated with resetting state control of PCIe core 500. Accordingly, it follows that all other affected internal states may be reset to a known default state for correspondence with resetting of management block 302. Next, below management block 302 are flip-flops 501 of CMM 307, and thus reset signal 512 is the second in the hierarchy. Notably, it is not necessary to assert reset signals 513 through 515 responsive to assertion of reset signal 512. However, generally once flip-flops 501 have been reset to different states, resetting other possibly affected internal states may be desirable. Next in the hierarchy is reset signal 513 as associated with PLM 305. Notably, of the physical, datalink, and transaction layers, respectively associated with PLM, 305, DLM 303, and TLM 301, the physical layer is the lowest. However, a lowest communication layer may be higher than other communications layers with respect to a reset hierarchy. If the state of DLM 303 is reset, then in order for correspondence of state with TLM 301, TLM 301 may also be reset. Thus, reset signal 514 is for resetting DLM 303 and TLM 301. Reset signals 513 and 514 may be asserted together. A separate user CMM reset signal 516 may be used to reset a user clock domain portion 504 of CMM 307 without resetting the remainder of CMM 307.

Reset block 309 may include a memory cell 523. Memory cell 523 may be set to select a reset mode, which will cause associated logic of reset block 309 to be configured for either a hierarchical reset mode or a hybrid hierarchical/separate reset mode. The hybrid hierarchical/separate reset mode is a hybrid of hierarchical and individual or separately set resets. The state of memory cell 523 may be set during configuration of an FPGA, such as FPGA 200 of FIG. 2.

FIG. 6 is a table diagram depicting an exemplary embodiment of a hierarchical reset mode 600. As shall become more apparent, a hierarchical reset mode and a hybrid hierarchical reset mode are described herein.

In a hierarchical reset mode 600, there is an association between reset inputs and affected internal resets. In the table diagram of FIG. 6, each input reset signal 511 through 516 is shown in a row of rows 601 and affected internal reset signals for such input reset signal are shown in columns 602. In the hierarchical reset mode, only one reset input is asserted for a reset event with reference to a PCIe core, such as PCIe core 210 of FIG. 3. Thus, for example, if the reset event or reset input, such as via reset signaling 520 of FIG. 5 for example, is to select management reset signal 511 as indicated by row 511 of rows 601, each of internal reset signals 511 through 516 is asserted as indicated by an X appearing in each of columns 511 through 516 of columns 602. If, however, the reset event is to select non-volatile reset signal 512, then management reset signal 511 is not asserted, and reset signals 512 through 516 are asserted. If the reset event selects MAC reset signal 513, then in a hierarchical mode, reset signals 511 and 512 are not asserted, and reset signals 513 through 516 are asserted. If the reset event is for link reset signal 514, then reset signals 511 through 513 are not asserted, and reset signals 514 through 516 are asserted. If the reset event is for user TLM reset signal 515, then reset signals 511 through 514 are not asserted, and reset signals 515 and 516 are asserted. Lastly, in a hierarchical mode, if the reset event is for user CMM reset signal 516, then only user CMM reset signal 516 is asserted, and reset signals 511 through 515 are not asserted.

FIGS. 7A and 7B are table diagrams depicting exemplary embodiments of a power-on reset condition 701 and a non-volatile reset condition 702, respectively, for a hierarchical reset mode. With simultaneous reference for FIGS. 7A and 7B, and renewed reference to FIG. 5, power-on reset condition 701 and non-volatile reset condition 702 are described.

For power-on reset condition 701, an FPGA, such as FPGA 200 of FIG. 2, is in a power-on reset mode. Accordingly, all of a PCIe core, such as PCIe core 210 of FIG. 3, may be reset during such power-on reset mode. In a hierarchical reset mode, this means that the power-on reset signal may be coupled to select as a reset event management reset signal 511. Notably, a power-on reset signal need not be coupled to management reset signal 511 per se, and thus this coupling may be a user option. Thus, a pin of reset block 309 associated with management reset signal 511 has a signal asserted on it responsive to the power-on reset signal, and pins associated with reset signals 512 through 516 do not have reset event signaling asserted thereon. However, even though pins associated with reset signals 512 through 516 do not have reset signaling asserted thereon, reset signals 512 through 516 are asserted in accordance with the table diagram of FIG. 6. Thus, in effect, even though "No's" are shown in the far right column of FIG. 7A for reset pins associated with reset signals 512 through 516, the signals themselves are in effect masked or hidden "Yes's" meaning that those reset signals are actually internally asserted resets.

For a non-volatile reset condition 702, the reset pin associated with non-volatile reset signal 512 has a reset event asserted thereon, and the reset pins associated with reset signals 511 and 513 through 516 do not have reset events asserted thereon. However, in a hierarchical reset mode, even though the reset pins associated with reset signals 513 through 516 do not have reset events asserted thereon, reset signals 513 through 516, in addition to reset signal 512, are asserted in accordance with the table diagram illustratively shown in FIG. 6.

If a user during configuration sets configuration memory cell 523 of reset block 309 of FIG. 5 to be in a hybrid hierarchical/separate reset mode, then individual resets may be asserted in some instances. FIG. 8 is a table diagram depicting an exemplary embodiment of a hybrid hierarchical/separate reset mode ("hybrid reset mode") 800. In hybrid reset mode 800, if a reset event is asserted to select management reset signal 511 for a reset input to reset block 309, then as previously described with respect to FIG. 6, reset signals 511 through 516 are asserted. In other words, in hybrid reset mode 800, management reset signal 511 is configured as it was in hierarchical reset mode 600.

However, reset events associated with reset signals 512 through 516 are individual or separate events. Thus, for example, if a reset event is asserted for an input pin associated with non-volatile reset signal 512, as indicated by row 512 of rows 801, then only non-volatile reset signal 512 is asserted when in hybrid reset mode 800, as indicated by an X appearing only in column 512 of columns 802. Furthermore, when a reset event is asserted with an input pin associated with MAC reset signal 513, then only MAC reset signal 513 is asserted. The same is equally true for reset signals 514 through 516, namely when a reset event is asserted for any of those pins, then only the corresponding reset signal is asserted. Notably, in hybrid reset mode 800, it is not necessary to assert only a single reset signal, and any combination of one or more of reset signals 512 through 516 may be asserted.

For a power-on reset condition, the table diagram of FIG. 7A applies equally to hybrid reset mode 800. However, if a user wanted to reset all blocks associated with reset signals 512 through 516, and not reset a management block associated with reset signal 511, as illustratively shown for a non-volatile reset condition in FIG. 7B, then reset events are sent to each input pin associated with reset signals 512 through 516. This example non-volatile reset condition 902 for a hybrid reset mode is illustratively shown in the table diagram of FIG. 9.

The above examples are merely a few of the examples that may be implemented, and accordingly it should be appreciated that other examples of reset events to be asserted or not asserted may be used. It should further be appreciated that by having a hierarchical reset mode and a hierarchical/separate reset mode, flexibility as between using either of such modes is provided. Furthermore, it should be appreciated that the hierarchical reset mode does not require a user to have an in depth understanding of the hierarchy internal to a PCIe hard core, as the user need only understand the highest level to which such PCIe hard core is to be reset. Furthermore, a power-on reset condition may be coupled to a reset input pin associated with a management reset signal, and thus the PCIe hard core may be completely reset regardless of which reset mode is selected.

By having separate reset selection capability, as in a hybrid reset mode, a user may control reset inputs for applications involving more flexibility. However, in applications that do not require such flexibility, the hierarchical reset mode may be used to simplify complexity of the reset use model. Furthermore, by having both reset modes, compatibility between different versions of an FPGA is enhanced.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A programmable device, comprising:
   a Peripheral Component Interconnect Express core instantiated as an application specific circuit block in the programmable device;
   the core having a reset block configured to be in either a hierarchical reset mode or a hierarchical/separate reset mode; and
   in the hierarchical reset mode, the reset block configured to assert a reset signal selected of a plurality of reset signals and to automatically assert each and every other reset signal of the plurality of reset signals lower in a reset hierarchy than the reset signal selected,
   wherein the plurality of reset signals are associated with resetting modules of the core in a hierarchical order in the hierarchical reset mode for operation of the core, and wherein a highest-level reset signal is associated with resetting state of a management block, the management block provides a read/write interface to a configuration management module.

2. The programmable device according to claim 1, wherein in both the hierarchical reset mode and the hierarchical/separate reset mode, the reset block is configured to assert all of the plurality of reset signals responsive to selection of the highest-level reset signal.

3. The programmable device according to claim 2, wherein in the hierarchical/separate reset mode, the reset block is configured to individually assert each of the plurality of reset signals other than the highest-level reset signal responsive to individual selection thereof provided the highest-level reset signal is not selected.

4. The programmable device according to claim 3, wherein the reset block is configured to be in either the hierarchical reset mode or the hierarchical/separate reset mode responsive to setting of configuration memory of the programmable device.

5. The programmable device according to claim 3, wherein a second-level reset signal is associated with resetting state of a configuration management layer module other than a user clock domain portion thereof.

6. The programmable device according to claim 5, wherein a third-level reset signal is associated with resetting state of a media access controller of a physical layer module.

7. The programmable device according to claim 6, wherein the fourth-level reset signal is associated with resetting state of a data link layer module and a transaction layer module other than a user clock domain portion thereof.

8. The programmable device according to claim 7, wherein the fifth-level reset signal is associated with resetting state of the user-clock domain portion of the transaction layer module.

9. The programmable device according to claim 8, wherein a sixth-level reset signal is associated with resetting state of the user-clock domain portion of the configuration management layer module.

10. A method for resetting an integrated circuit, comprising:
    obtaining the integrated circuit with an application specific circuit block, the application specific circuit block being a Peripheral Component Interconnect Express core;
    configuring a reset block of the core to be in either of a first reset mode or a second reset mode;
    coupling a power-on reset state to a first reset input of the reset block;
    the first reset input being associated with a highest-level reset signal of a reset hierarchy associated with the core, the reset hierarchy including a plurality of reset signals, the highest-level reset signal being one of the plurality of reset signals;
    initiating the power-on reset state for the integrated circuit causing the highest-level reset signal to be asserted; and
    resetting the core, the resetting of the core including:
        asserting each of the plurality of reset signals responsive to assertion of the highest-level reset signal.

11. The method according to claim 10, wherein the integrated circuit is a programmable logic device.

12. The method according to claim 11, wherein the programmable logic device is of a columnar architecture; and wherein the core is instantiated in a column of the programmable logic device.

13. The method according to claim 10, wherein the first reset mode and the second reset mode respectively are a hierarchical reset mode and a hierarchical/separate reset mode.

14. A method for resetting an integrated circuit, comprising:
    obtaining the integrated circuit with an application specific circuit block, the application specific circuit block being a Peripheral Component Interconnect Express core;
    configuring a reset block of the core to be in either of a hierarchical reset mode and a hierarchical/separate reset mode, the reset block being associated with a plurality of reset signals in a reset hierarchy;
    in the hierarchical reset mode,
        asserting a selected reset signal of the plurality of reset signals and automatically asserting each and every other reset signal of the plurality of reset signals lower in the reset hierarchy than the selected reset signal;
        resetting at least a portion of the core responsive to the asserting the plurality of reset signals being associated with resetting modules of the core in a hierarchical order for operation of the core; and
    operating the core after the resetting thereof,
    wherein a highest-level reset signal is associated with resetting state of a management block, the management block provides a read/write interface to a configuration management layer module.

15. The method according to claim 14, wherein in both the hierarchical reset mode and the hierarchical/separate reset mode, the reset block is configured to assert all of the plurality of reset signals responsive to selection of the highest-level reset signal as the selected reset signal to completely reset the core.

16. The method according to claim 15, wherein in the hierarchical/separate reset mode, the reset block is configured to individually assert each of the plurality of reset signals responsive to individual selection thereof provided the highest-level reset signal is not the selected reset signal, the individual selection for resetting those portions of the core associated with the plurality of reset signals asserted.

17. The method according to claim 16, wherein the integrated circuit is a programmable logic device of a columnar architecture; and wherein the core is instantiated in a column of the programmable logic device.

18. The method according to claim 16, wherein a second-level reset signal is associated with resetting state of the configuration management layer module; and wherein a third-level reset signal is associated with resetting state of a media access controller of a physical layer module.

19. The method according to claim 18, wherein the fourth-level reset signal is associated with resetting state of a data link layer module and a transaction layer module other than a user clock domain portion thereof; wherein the fifth-level reset signal is associated with resetting state of the user-clock domain portion of the transaction layer module; and wherein a sixth-level reset signal is associated with resetting state of a user-clock domain portion of the configuration management layer module.

\* \* \* \* \*